United States Patent [19]

Stokar

[11] Patent Number: 4,859,945
[45] Date of Patent: Aug. 22, 1989

[54] OPTIMIZED SIGNAL TO NOISE RATIO

[75] Inventor: Saul Stokar, Raanana, Israel

[73] Assignee: Elscint Ltd., Haifa, Israel

[21] Appl. No.: 189,712

[22] Filed: May 3, 1988

[51] Int. Cl.$^4$ ............................................. G01R 33/20
[52] U.S. Cl. ..................................... 324/309; 324/307
[58] Field of Search ............... 324/300, 307, 309, 312, 324/313, 314, 318, 322; 128/653

[56] References Cited

U.S. PATENT DOCUMENTS

| | | | |
|---|---|---|---|
| 4,070,708 | 1/1978 | Smallcombe | 324/307 |
| 4,390,840 | 6/1983 | Ganssen | 324/309 |
| 4,442,404 | 4/1984 | Bergmann | 324/309 |
| 4,521,733 | 6/1985 | Bottomley | 324/309 |
| 4,549,138 | 10/1985 | Suzuki | 324/309 |
| 4,626,784 | 12/1986 | Sepponen | 324/309 |
| 4,709,212 | 11/1987 | MacFall | 324/309 |
| 4,728,893 | 3/1988 | Feinberg | 324/309 |
| 4,777,438 | 10/1988 | Holland | 324/309 |

Primary Examiner—Michael J. Tokar
Attorney, Agent, or Firm—Sandler & Greenblum

[57] ABSTRACT

Method and apparatus for improving the signal-to-noise ratio in magnetic resonance imaging systems using echo acquisition modes. The bandwidth of the received signals are reduced along with the amplitude of the view gradient and the sampling time. Since the signal-to-noise ratio is proportional to one over the square root of the bandwidth, this results in an increased signal-to-noise ratio.

13 Claims, 4 Drawing Sheets

OPTIMIZED SIGNAL TO NOISE RATIO

FIELD OF THE INVENTION

This invention is concerned with magnetic resonance imaging (MRI) systems and more particularly to methods and equipment for increasing the signal-to-noise ratio (SNR) in such systems.

BACKGROUND OF THE INVENTION

Magnetic resonance imaging systems take advantage of magnetic resonance phenomena to obtain tomographic images of the interior of living subjects. This capability of obtaining tomographic images without using X-rays or other forms of radiation is advantageous because it removes the radiation risks. In addition magnetic resonance systems can provide excellent images of soft tissues as well as bone. Further MRI systems have the capability of obtaining physiogical images in addition to anatomical images.

MRI relies on the fact that certain isotopes, those having an odd number or neutrons or electrons exhibit magnetic moments that when subjected to a large static magnetic field tend to statistically align with the magnetic field. The aligned isotopes ("spins") rotate or precess around the axis of the large magnetic field at a rotational frequency that is equal to the gyromagnetic constant ($\gamma$) for the aligned isotope multiplied by the strength of the magnetic field (B) applied to the isotope being imaged. Mathematically, then: $\omega_o = \gamma B$. This rotational frequency is known as the Larmor frequency.

If a patient is positioned in a strong static magnetic field and a radio frequency (RF) pulse having the Larmor frequency is applied to a portion of the patient, then the spins at that portion of the patient are "tipped" or perturbed into a transverse plane relative to the axis of the strong static magnetic field. The spins so tipped tend to dephase and revert to the original aligned position after removal of the RF pulse. The rotation in the transverse plane generates small signals that decay due to the dephasing and the reverting. These small signals are known as free induction decay (FID) signals since they occur after the removal of the radio frequency pulse. "Echo" signals are also generated responsive to steps taken to rephase the dephasing spins, i.e. Hahn echoes or gradient echoes. The time-to-echo (TE) is equal to the time between a "tipping" radio frequency pulse and the echo signal; which at a minimum is equal to twice the time tau ($\tau$) between the "tipping" pulse and a rephasing pulse. The time-to-echo can be manipulated by the operator, but usually the time-to-echo should be kept at a minimum, especially for the first echo, to obtain maximum signals.

The location of the signals are determined using magnetic gradients. The magnetic gradients set the strength of the static magnetic field as a function of location. The frequency of the received signal is related to the strength of the magnetic field at the spins generating the signals and consequently to the location of the signal source. Thus the location of the source of the signals (FID or echo) can be determined and spatial images can be constructed.

Multi-dimensional images are acquired using encoding gradients along the axes of the transverse plane. In two-dimensional imaging one axis is time encoded and the other axis is phase encoded, for example.

It is to be understood that the acquired signals are exceedingly small and consequently anything that can be done to improve the signal-to-noise ratio (SNR) of the received signals is beneficial and important. Usually any improvement in the SNR comes at a cost of either time or resolution. For example, one method of improving the SNR is by repeating the acquisition of the signals and then averaging the repeated signals so acquired.

Averaging, of course, requires additional time for acquiring the duplicate or multiple signals and accordingly time is being paid for the improved SNR obtained thereby. Those skilled in the art are continuously searching for apparatus and methods for improving the SNR of the received signals in MRI systems. They are especially attempting to provide methods and apparatus for improving the SNR while expending a minimum amount of time or resolution.

BRIEF DESCRIPTION OF THE INVENTION

According to the present invention a method of improving the SNR of the MRI images is provided, said method comprising the steps of:

determining that the time to echo (TE) can be more than minimal, applying an acquisition sequence to acquire echo signals, said acquisition sequence including the application of view gradients during the receipt of the echo signals, using a fixed field of view with said acquisition sequence, sampling said echo signals generated by said acquisition sequence, filtering the sampled signals through a receiving filter, reducing the amplitude of said view gradient when the time to echo is more than minimal, and reducing the bandwidth of the receiving filter to thereby maintain the fixed field of view and to improve the SNR.

A feature of the invention includes maintaining the view gradient amplitude at a level sufficient to prevent truncation artifacts.

Another feature of the invention comprises automatically changing the bandwidth of the filter and the sampling rate responsive to changing the amplitude of the view gradient and changing both responsive to a determination that the TE does not have to be minimal.

Yet another and related feature comprises changing the filter bandwidth from echo to echo in a multi-echo sequence to maximize the signal-to-noise-ratio for each echo separately.

BRIEF DESCRIPTION OF THE DRAWINGS

The above mentioned and other features and objects of the present invention will be best understood when considered in the light of the following description of a broad aspect of the present invention made in conjunction with the accompanying drawing; wherein.

GENERAL DESCRIPTION

Figure 1:
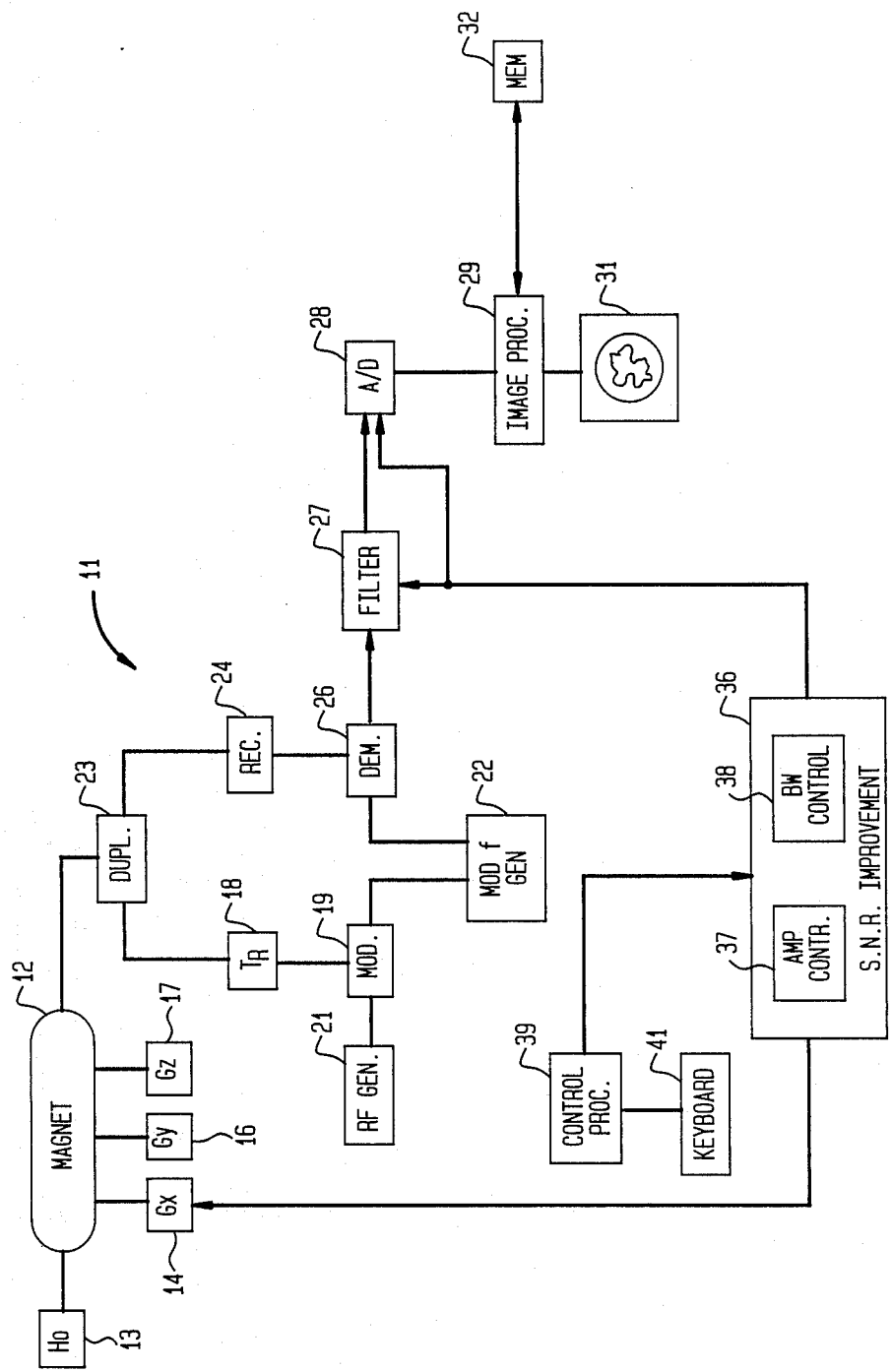
FIG. 1 is a block diagram of an MRI system including the present invention.

The signal-to-noise ratio is a function of the bandwidth of the received signal. In fact the SNR is proportional to one over the square root of the bandwidth (BW) of the received signal (SNR=$1/\sqrt{BW}$). Therefore, it would seem that to improve the SNR it would only be necessary to reduce the bandwidth of the received signal. However, the bandwidth is also related to other characteristics and criteria of the MRI system. For example, Bandwidth $(BW) = \gamma \cdot FOV Gv/2$;

where:
 $\gamma$ is the gyromagnetic constant;
 FOV is the field of view, and
 Gv is the amplitude of the view gradient.

Further, the bandwidth in frequency is the inverse of the time between sampling points, herein indicated by delta T ($\Delta T$) in seconds. Notice that to maintain a constant FOV the view gradient amplitude has to be changed whenever the bandwidth is changed. However, there are constraints on the view gradient.

The view gradient ideally should be much larger than the field inhomogeneity ($\Delta Bo$); since, if the view gradient is smaller than the field inhomogeneity it will be difficult to use the view gradient for locating the source of the acquired signal. Another constraint on the amplitude of the view gradient is that the size of each pixel should be larger than the chemical shift. Since the pixel size is equal to the FOV divided by the number of pixels, i.e.: Pixel size=FOV/(No. of Pixels)=$2BW/\gamma \cdot Gv \cdot$(No. of Pixels). Accordingly, the pixel size is a function of the relation between the bandwidth and the view gradient amplitude.

Yet another constraint is the fact that in the standard spin echo sequence, the spins are dephased prior to detection in order to sample a full echo. In this case, the time to echo (TE) is a function of the amplitude of the view gradient. The larger the view gradient the shorter is the time to echo and the smaller the amplitude of the view gradient the longer is the time to echo. Accordingly, where the operator desires a minimum time to echo then the view gradient cannot be reduced.

One method of overcoming this constraint is to avoid using a dephasing gradient before the sampling. When the dephasing gradient is omitted the time to echo TE is not affected by the gradient strength. However, since only half an echo is obtained, some procedure must be used to reconstruct the missing data. While such procedures are known to exist, they are sensitive to a variety of system imperfections and often lead to image artifacts. In addition, such methods suffer from a $\sqrt{2}$ decrease in signal-to-noise ratio.

However, whenever there is no strong requirement for a minimum time to echo, such as is often the case during the acquisition of the subsequent echo signals occurring after the first echo, then the view gradient amplitude can be reduced. For a constant FOV where the view gradient is reduced, the sampling rate is slowed and the BW can be reduced. Thus for all situations where the view gradient amplitude can be reduced without affecting the aims of the experiments, the SNR will be improved by reducing both the amplitude of the view gradient and the bandwidth.

Turning now to FIG. 1, a broad aspect of the invention for optimizing the SNR is will be described. In the MRI system 11 of FIG. 1, a magnet 12 sufficiently large to enable a patient to be received therein is shown. In a preferred embodiment, a superconducting type magnet is provided. However, the invention is sufficiently broad to encompass other types of magnets.

The magnet includes coils which are energized by the main magnet energization generator, Ho, and designated by the reference numeral 13. The main magnet generates a large static magnetic field in a bore of the magnet.

The axis of the magnetic field is generally assigned the Z direction in an XYZ orthogonal system. To locate acquired signals, selected ones of the gradient coils are energized at precisely selected times. The coils are not shown, but the gradient field energization generator 14 for the X gradient, the gradient field energization generator 16 for the Y gradient and the gradient field energization generator 17 for the Z gradient are shown.

The large static magnetic field passes through the patient to align the spins internal to the patient. RF pulses from the transmitter 18 are applied to RF coils, not shown, within the magnet. The RF pulses can be shaped by modulator 19 which receives RF pulses from the RF generator 21 and a modulating frequency from generator 22. The modulated pulse is transmitted to a duplexer 23. The duplexer enables the transmitted pulse to be applied to the RF coils of the magnet 12. Responsive to the application of the RF pulse, the aligned spins in the patient are perturbed or "tipped" into the transverse XY plane. The rotating dephasing and reverting spins generate decaying FID signals, which can be rephased to produce echo signals. The signals are received by receiving RF coils (not shown) in the magnet. The receiving RF coils in the magnet can either be the same coils used for transmitting or a different set of coils, within the scope of this invention. The signals detected by the RF coils in the magnet are connected through the duplexer 23 to a receiver 24.

Echo signals are generated responsive to the rephasing of the dephasing spins in the transverse plane. A 180 degree Rf pulse and/or inverse gradients are applied to rephase the dephasing spins. The rephased spins constitute the echo signal. The echo signal is detected by the RF coil and sent through the receiver 24 to be demodulated in a demodulating unit 26. The demodulating unit receives a demodulating frequency from modulation frequency generator 22. The output of the demodulator 26 goes through a low-pass filter 27. In a preferred embodiment, the filter normally has a bandwidth of approximately 6.7 KHz. The filtered signal then goes to an analog to digital converter 28. The digital signal is processed in image processor 29 for providing an image on display unit 31. Memory means 32 may be used by the image processor.

The system herein includes SNR improvement means 36 which comprises amplitude controller means 37 for changing the amplitude of the view gradient (which is generally the "X" gradient) and bandwidth controller means 38 for changing the bandwidth of the filter.

The operation of the entire system is under the control of a control processor shown at 39. The control processor has attached thereto input equipment 41, such as a keyboard for inputting information and/or commands. For example, the operator of the system can indicate to the control processor that the time to echo TE can be increased and, therefore, it is possible to reduce the view gradient amplitude. More particularly an enabling signal is provided to the unit 36 which then operates the amplitude controller 38 for controlling the amplitude of the pulse supplied from the view gradient equipment Gx and bandwidth controller for controlling the bandwidth of filter 27. Alternatively, the filter bandwidth and the gradient amplitude are changed automatically to optimize the signal-to-noise ratio. For example, the system automatically varies the gradient amplitude and the bandwidth of the filter after receipt of the first echo signal so that the SNR of subsequent echo signals are optimized.

The exact type of the filter utilized is not important to the invention. What is important is that the bandwidth can be changed responsive to changing the amplitude of the view gradient to maintain a fixed field of view. In preferred embodiment, wherein the main magnet is a half Tesla magnet, the amplitude of the view gradient can be changed from 0.125 G/CM to 0.0625 G/CM. The bandwidth is simultaneously reduced from around 6.7 KHz to 3.35 KHz.

Figure 2:
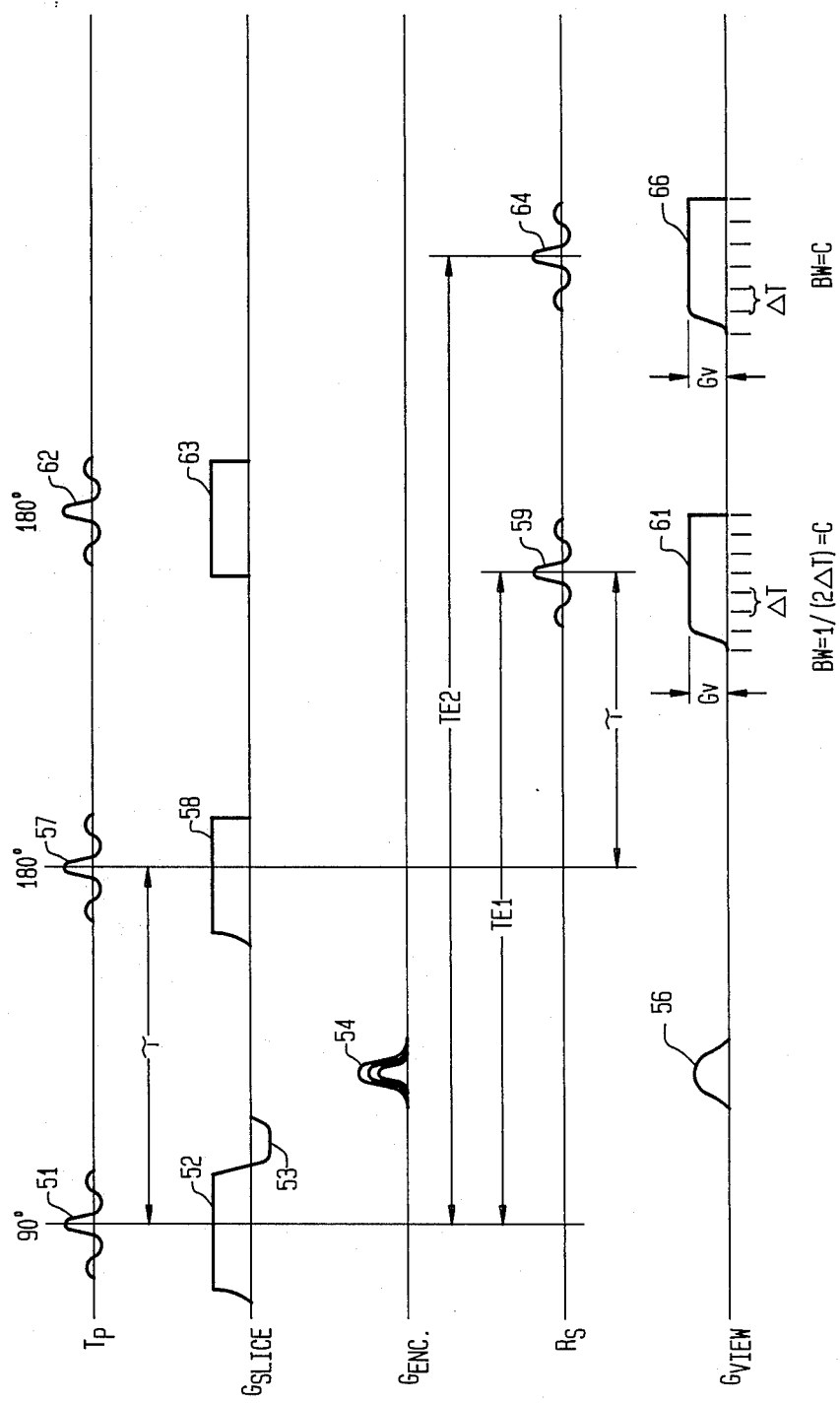
FIG. 2 shows a standard spin echo acquisition sequence where $TE_1$ and $TE_2$ are both maintained at minimum values for the first and second echoes, for example.

FIG. 2 shows a standard spin echo sequence where the time-to-echo is minimum both for the first echo and for subsequent echoes represented by the second echo. The sequence starts with a 90 degree radio frequency pulse indicated at 51. The pulse is applied during the application of the slice selecting gradient 52. The usual negative going dephasing portion of the slice selecting gradient is shown at 53. The phase encoding gradient is shown at 54. A dephasing gradient in the view direction is shown at 56. At a time tau ($\tau$) after the application of the 90 degree RF pulse, a rephasing 180 degree RF pulse 57 is applied during the application of slice select gradient 58. At the time tau ($\tau$) subsequent to the application of the 180 degree RF pulse, an echo signal 59 is received during the application of a view gradient 61. The receipt of the echo signal 59 occurs at the time to echo TE which is equal to $2\tau$ after the application of the initial radio frequency pulse 51.

In FIG. 2, a minimum TE is desired for the first and subsequent echoes. At a time $\tau$ after the receipt of the first echo 59, a second 180 degree RF pulse 62 is applied during the application of a slice select gradient 63. At a time $\tau$ after the application of the second 180 degree RF pulse 62 a second echo signal 64 is received. A view gradient 66 is applied to coincide with the receipt of the echo signal 64. As a matter of fact, ideally the echo signal 64 is received at about the time that the area of view gradient 61 after the first echo is equal to the area under the view gradient 66. In FIG. 2 the bandwidth is equal to C which is equal to $1/(2\Delta\tau)$ where $\Delta T$ is the sampling time. The standard frequency of FIG. 2 uses the same sampling time for the first echo signal as for subsequent echo signals. The bandwidth is the same for the first and subsequent echo signals and the view gradient amplitude is the same for the first and subsequent echo signals. Thus, in FIG. 2 there is no change in bandwidth between the first and subsequent echoes and hence no improvement in the signal-to-noise ratio.

Figure 3:
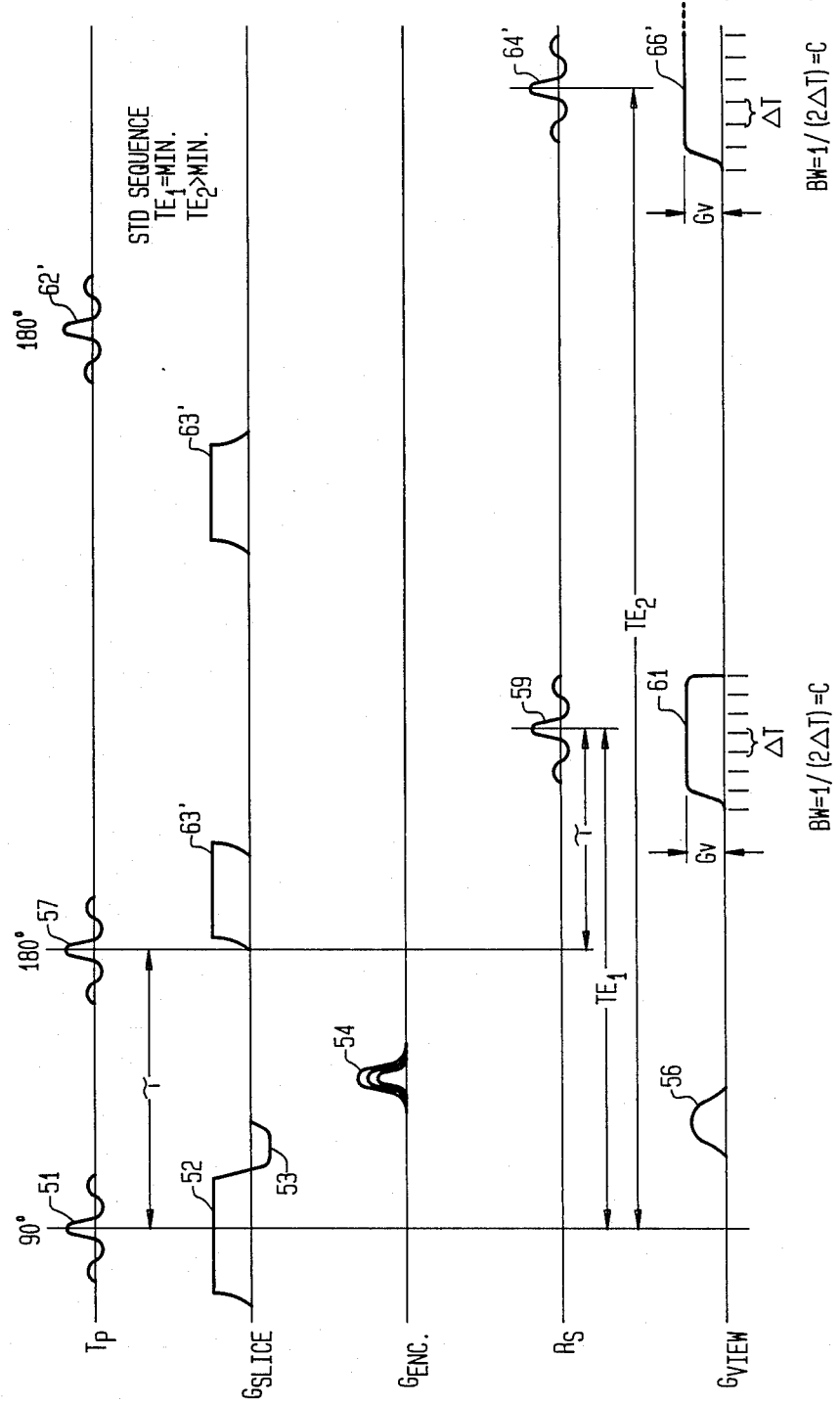
FIG. 3 shows a standard spin echo acquisition sequence where $TE_1$ is minimal, but $TE_2$ is larger than minimal.

FIG. 3 shows a standard sequence as done in the prior art where TE1 is kept at a minimum but TE2 is not kept at a minimum. This is a distinction over FIG. 2 where both TE1 and TE2 indicated a minimum time to echo. The same reference numbers are used to designate the same signals, gradients and pulses in FIG. 2 and FIG. 3. Prime numbers are used for reference purposes in FIG. 3 to show that the pulses and gradients are applied at different times. Note that the bandwidth of the filter for both the first and subsequent echo signals are both equal to $1/(2\Delta T)$ or C.

Figure 4:
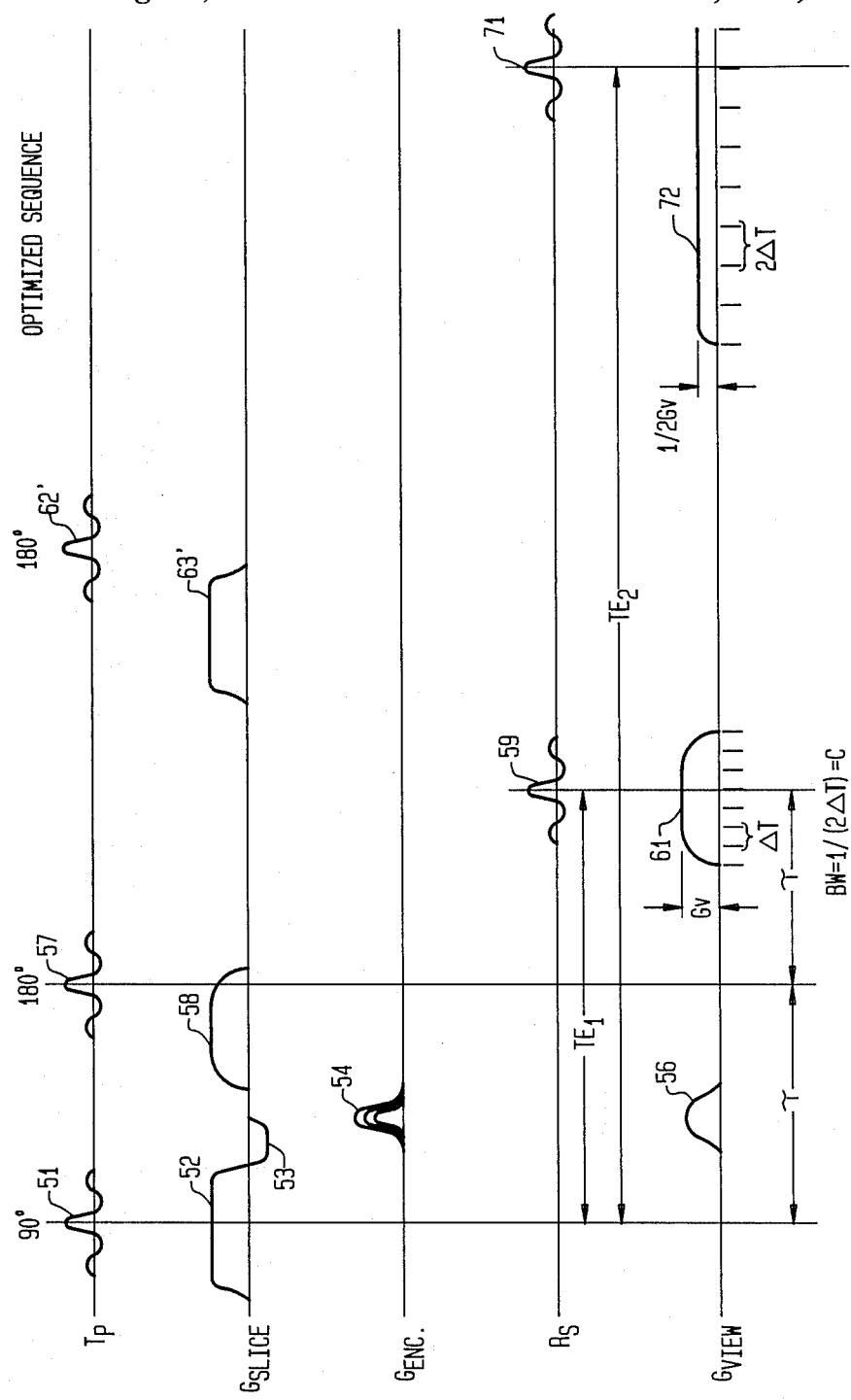
FIG. 4 shows an optimized sequence according to the invention.

FIG. 4 shows the sequence in accordance with the present invention where the face that TE2 may be larger than minimum is recognized and taken advantage of by decreasing the amplitude of the view gradient for receipt of the second and subsequent echo signals. In addition, to maintain the same field of view, the sampling time is increased. In the sample of FIG. 4 the view gradient of the second and subsequent echoes is shown as being about half the amplitude of the view gradient used for the first echo. In addition, the sampling time is shown as being doubled to $2\Delta T$. Accordingly, the bandwidth for subsequent signals is half the bandwidth of the first echo signal (i.e. equal to C/2) and the signal-to-noise ratio is increased by $\sqrt{2}$ or 1.414, since SNR=$1/\sqrt{BW}$ (first signal)=$\sqrt{2}$ (for subsequent signals).

In FIGS. 3 and 4 the first and second RF signals 51, 57 are the same. Similarly, the slice select gradients 52, 58 applied are the same in FIGS. 3 and 4. The second 180 degree RF signal 62' applied is the same and the slice select gradient 63' applied during the application of the second RF signal are also the same in FIGS. 3 and 4. However, the view gradient 72 applied during the receipt of the second echo 71 in FIG. 4 is half the amplitude of the view gradient 66' applied in FIG. 3. Also the sampling rate of the second echo in FIG. 4 is half the sampling rate of FIG. 3. The signal-to-noise ratio is equal to 1 over square root of the bandwidth, since the bandwidth of the second echo is $\frac{1}{2}$ C or $\frac{1}{2}$ the bandwidth of the second echo in FIGS. 2 and 3 the signal-to-noise ratio increases by a factor of $\sqrt{2}$. This is accomplished without any significant extra time required as shown by comparison of TE2 of FIGS. 3 and 4 and without any loss of resolution.

In operation, the operator of the system inputs whether or not to use the normal view gradient amplitude and the normal bandwidth. If the normal bandwidth and view gradient are not used then the SNR improvement unit 36 causes the amplitude controller to reduce the amplitude of the view gradient and at the same time causes the bandwidth controller to reduce the bandwidth of the filter 27. Alternatively, during procedures such as acquiring multiple echoes where the TE of the second or subsequent echoes may exceed its minimum value, the bandwidth, the view gradient amplitude and sampling rate of these echoes are all reduced in equal proportion to increase the SNR without increasing the acquisition time or reducing the resolution.

While the invention has been described using a specific embodiment, it should be understood that this description is by way of example only and not meant as a limitation on the scope of the invention. The scope of the invention is defined by the accompanying claims.

What is claimed is:

1. A method of optimizing the signal-to-noise ratio (SNR) of magnetic resonance images (MRI) in echo acquisition scan sequences providing echoes at times (TE) after application of a first radio frequency (RF) pulse, said method comprising the steps of:

using said echo acquisition sequence to generate echo signals, detecting a first echo signal during the application of an initial view gradient, sampling the detected echo signal at a sampling rate determining a sampling time, filtering the sampled signal through a receiving filter having a variable bandwidth, providing a subsequent view gradient of decreased amplitude compared to said initial view gradient during the detection of subsequent echo signals, and decreasing the bandwidth of the receiving filter responsive to the reduction of the subsequent view gradient amplitude to improve the SNR.

2. The method of claim 1 including the step of:

determining to increase TE times beyond a minimum time where the minimum time is equal to the least amount of time necessary to apply slice select dephasing and rephasing pulses, an encoding gradient pulse and a second RF pulse after application of a first RF pulse in the echo acquisition scan sequence.

3. The method of claim 1 including the step of increasing the TE time for echoes subsequent to the first echo received, said step of increasing the TE time including the step of reducing the amplitude of the view gradient during the detection of the subsequent echo signals, and simultaneously decreasing the bandwidth of the receiving filter responsive to the reduction of the view gradient amplitude to thereby maintain a field of view and to acquire images having improved signal-to-noise ratio.

4. The method of claim 3 including the step of increasing the sampling time of the signals received using the subsequent view gradient of reduced amplitude.

5. The method of claim 1 wherein the reduction of the amplitude of the subsequent view gradient is limited to prevent truncation artifacts.

6. The method of claim 1 wherein the subsequent view gradient is maintained larger than the field inhomogeneity.

7. The method of claim 1 wherein the subsequent view gradient is maintained at an amplitude to assure that the size of each pixel is larger than the chemical shift.

8. A system for optimizing the signal-to-noise ratio (SNR) of magnetic resonance images (MRI) in echo acquisition scan sequences providing echoes at times-to-echo (TE) after application of a first radio frequency (RF) pulse, while increasing the time-to-echo TE between the application of said first RF pulse and a rephasing RF pulse that causes the echo to occur at a time beyond a minimum time where the minimum time is governed by the least amount of the necessary to apply slice select gradient pulses, an encoding gradient pulse and a first rephasing RF pulse after the application of the first RF pulse, said system comprising:

means for acquiring MRI data using said echo acquisition sequence for generating echo signals, means for detecting said first echo signal during the application of an initial view gradient, means for receiving the detected signals, receiving filter means for filtering the received signals, said receiving filter means having a variable bandwidth, means for providing a subsequent view gradient pulse of decreased amplitude relative to said initial view gradient pulse during the detection of subsequent echo signals whereby TE is larger than the minimal, and means for decreasing the bandwidth of the receiving filter means responsive to the reduction of the subsequent view gradient pulse amplitude to improve the SNR.

9. The system of claim 8 including the means for increasing the TE time for echoes subsequent to the initial echo received, said means for providing the subsequent view gradient of reduced amplitude is operative only during the detection of the subsequent echo signals.

10. The system of claim 8 including means for increasing the sampling time of the signals received using the subsequent view gradient of reduced amplitude.

11. The system of claim 8 wherein the reduction of the amplitude of the subsequent view gradient is limited to prevent truncation artifacts.

12. The system of claim 8 wherein the subsequent view gradient is maintained larger than the field inhomogeneity.

13. The system of claim 8 wherein the subsequent view gradient is maintained at an amplitude to assure that the size of each pixel is larger than the chemical shift.

* * * * *